US011695003B2

(12) United States Patent
Lee

(10) Patent No.: US 11,695,003 B2
(45) Date of Patent: Jul. 4, 2023

(54) SEMICONDUCTOR DEVICE, ELECTRONIC SYSTEM, AND ELECTROSTATIC DISCHARGE PROTECTION METHOD FOR SEMICONDUCTOR DEVICE THEREOF

(71) Applicant: NANYA TECHNOLOGY CORPORATION, New Taipei (TW)

(72) Inventor: Chun-Lu Lee, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 47 days.

(21) Appl. No.: 17/396,275

(22) Filed: Aug. 6, 2021

(65) Prior Publication Data

US 2023/0042003 A1   Feb. 9, 2023

(51) Int. Cl.
*H01L 23/60*   (2006.01)
*H01L 27/02*   (2006.01)
(Continued)

(52) U.S. Cl.
CPC ...... *H01L 27/0288* (2013.01); *H01L 25/0657* (2013.01); *H01L 27/0296* (2013.01);
(Continued)

(58) Field of Classification Search
CPC ............. H01L 27/0288; H01L 25/0657; H01L 27/0296; H01L 2225/06513;
(Continued)

(56) References Cited

U.S. PATENT DOCUMENTS 5,995,354 A * 11/1999 Yu .................. H01L 27/0288
361/111
6,014,305 A * 1/2000 Yu .................. G01R 31/002
361/111
(Continued)

FOREIGN PATENT DOCUMENTS

CN   107887382 A   4/2018
CN   110914984 A   3/2020
(Continued)

OTHER PUBLICATIONS

CN Office Action for Application No. 110145889 dated Jan. 6, 2023 with search report attached, 8 pgs.

*Primary Examiner* — Samuel Park
(74) *Attorney, Agent, or Firm* — Muncy, Geissler, Olds & Lowe, P.C.

(57) ABSTRACT

The present application discloses a semiconductor device, an electronic system and an electrostatic discharge (ESD) protection method for a semiconductor device thereof. The semiconductor device includes a substrate, an operation solder structure disposed on a first surface of the substrate for receiving an operation signal, a detection solder structure disposed on the first surface of the substrate for receiving a chip connection signal, and a semiconductor chip disposed on a second surface of the substrate. The semiconductor chip includes an operation electrical contact coupled to the operation solder structure, a detection electrical contact coupled to the detection solder structure, an ESD protection unit coupled to the operation electrical contact, and a logic circuit (Continued)

coupled to the detection electrical contact for adjusting capacitance of the ESD protection unit according to the chip connection signal.

16 Claims, 12 Drawing Sheets

(51) Int. Cl.
*H01L 25/065* (2023.01)
*H10B 12/00* (2023.01)

(52) U.S. Cl.
CPC .... *H10B 12/50* (2023.02); *H01L 2225/06513* (2013.01); *H01L 2225/06541* (2013.01); *H01L 2225/06572* (2013.01)

(58) Field of Classification Search
CPC .......... H01L 2225/06541; H01L 2225/06572; H10B 12/50
See application file for complete search history.

(56) References Cited

U.S. PATENT DOCUMENTS

| | | | | |
|---|---|---|---|---|
| 2002/0153570 | A1* | 10/2002 | Lin | H01L 27/0266 257/355 |
| 2002/0167348 | A1* | 11/2002 | Kim | H01L 23/642 327/310 |
| 2005/0098798 | A1* | 5/2005 | Miyazawa | H01L 23/60 257/200 |

FOREIGN PATENT DOCUMENTS

| | | | | |
|---|---|---|---|---|
| KR | 20100053046 A | * | 5/2010 | ......... H10B 12/0335 |
| TW | M601902 U | | 9/2020 | |
| TW | I713146 B | | 12/2020 | |

\* cited by examiner

SEMICONDUCTOR DEVICE, ELECTRONIC SYSTEM, AND ELECTROSTATIC DISCHARGE PROTECTION METHOD FOR SEMICONDUCTOR DEVICE THEREOF

TECHNICAL FIELD

The present disclosure relates to a semiconductor device, and more particularly, to a semiconductor device including electrostatic discharge protection units of adjustable capacitance.

DISCUSSION OF THE BACKGROUND

Electrostatic discharge (ESD) occurs when two differently-charged objects contact with each other. For example, when a pad of a semiconductor chip contacts a charged object, such as human structure or a circuit board, an ESD event would occur. In such case, a drastic discharge current will be induced on the pad of the semiconductor chip so as to discharge charges accumulated in the semiconductor chip or the charged object. To protect components in the semiconductor chip from being damaged by the drastic and intensive discharge current, ESD protection circuits are often added to pads of the semiconductor chip.

However, the ESD protection circuits often include capacitive elements, which may cause distortion to signals received by the pads. For example, a rise time and a fall time of a signal will be extended because the signal has to charge or discharge the capacitive elements. Furthermore, as signals have higher frequencies, it would be even more difficult to identify the data delivered by the signals. In addition, in a multi-chip device, such as a memory device including multiple stacked dynamic random access memory (DRAM) chips, the chips of different ranks may be coupled together for receiving the same signals. In such case, those signals will have to charge or discharge capacitive elements in all of the chips that coupled together, thereby further deteriorate the quality of signals.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, an operation solder structure, a detection solder structure, and a first semiconductor chip. The operation solder structure is disposed on a first surface of the substrate and configured to receive an operation signal. The detection solder structure is disposed on the first surface of the substrate, and configured to receive a chip connection signal. The semiconductor chip is disposed on a second surface of the substrate, and comprises a first operation electrical contact, a first detection electrical contact, a first electrostatic discharge (ESD) protection unit, and a first logic circuit. The first operation electrical contact is coupled to the operation solder structure through the substrate. The first detection electrical contact is coupled to the detection solder structure through the substrate. The first ESD protection unit is coupled to the first operation electrical contact. The first logic circuit is coupled to the first detection electrical contact, and configured to adjust capacitance of the first ESD protection unit according to the chip connection signal.

In some embodiments, the first semiconductor chip further comprises a memory circuit configured to perform operations according to at least the operation signal.

In some embodiments, the first ESD protection unit comprises a first ESD protection element coupled between the first operation electrical contact and a voltage terminal, a second ESD protection element, and a control circuit coupled in series with the second ESD protection element between the operation electrical contact and the voltage terminal. The voltage terminal is coupled to a ground or a power voltage.

In some embodiments, the control circuit comprises a switch, and the first logic circuit is configured to turn on or turn off the switch for adjusting the capacitance of the first ESD protection unit.

In some embodiments, the control circuit comprises a fuse, and the first logic circuit is configured to burn out the fuse to decrease the capacitance of the first ESD protection unit.

In some embodiments, the semiconductor device further comprises a second semiconductor chip disposed laterally near the first semiconductor chip on the second surface of the substrate or stacked on the first semiconductor chip. The second semiconductor chip comprises a second operation electrical contact, a second detection electrical contact, a second ESD protection unit, and a second logic circuit. The second operation electrical contact is coupled to the operation solder structure. The second detection electrical contact is coupled to the detection solder structure. The second ESD protection unit is coupled to the second operation electrical contact. The second logic circuit is coupled to the second detection electrical contact, and configured to adjust capacitance of the second ESD protection unit according to the chip connection signal.

Another aspect of the present disclosure provides an electronic system comprising a circuit board, a first semiconductor device, and a second semiconductor device. The first semiconductor device is coupled to the circuit board, and comprises a first substrate, a first operation solder structure, a first detection solder structure, and a first semiconductor chip. The first operation solder structure is disposed on a first surface of the first substrate and configured to receive a first operation signal. The first detection solder structure is disposed on the first surface of the first substrate, and configured to receive a first chip connection signal. The first semiconductor chip is disposed on a second surface of the first substrate, and comprises a first operation electrical contact, a first detection electrical contact, a first ESD protection unit and a first logic circuit. The first operation electrical contact is coupled to the first operation solder structure. The first detection electrical contact is coupled to the first detection solder structure. The first ESD protection unit is coupled to the first operation electrical contact. The first logic circuit is coupled to the first detection electrical contact, and configured to adjust capacitance of the first ESD protection unit according to at least the first chip connection signal.

In some embodiments, the first semiconductor device further comprises a second semiconductor chip disposed laterally near the first semiconductor chip on the second surface of the first substrate or stacked on the first semiconductor chip. The second semiconductor chip comprises a second operation electrical contact, a second detection electrical contact, a second ESD protection unit, and a second logic circuit. The second operation electrical contact is coupled to the first operation solder structure. The second detection electrical contact is coupled to the first detection solder structure. The second ESD protection unit is coupled to the second operation electrical contact. The second logic circuit is coupled to the second detection electrical contact, and configured to adjust capacitance of the second ESD protection unit according to the first chip connection signal.

In some embodiments, the electronic system further comprises a second semiconductor device coupled to the first semiconductor device through the circuit board. A structure of the second semiconductor device is same as a structure of the first semiconductor device. The second semiconductor device and the first semiconductor device receive the first operation signal and perform operations in parallel accordingly. A third logic circuit of a third semiconductor chip in the second semiconductor device is configured to adjust capacitance of a third ESD protection unit of the third semiconductor chip according to the first chip connection signal.

In some embodiments, the first semiconductor device is disposed on a first surface of the circuit board, and the second semiconductor device is disposed on a second surface of the circuit board, or the first semiconductor device and the second semiconductor device are disposed laterally on a same surface of the circuit board.

In some embodiments, the first semiconductor chip further comprises a memory circuit configured to perform operations according to at least the first operation signal.

In some embodiments, the electronic system further comprises a third semiconductor device coupled to the first semiconductor device through the circuit board, wherein the third semiconductor device comprises a memory controller configured to control the memory circuit in the first semiconductor chip and generate the first chip connection signal.

In some embodiments, the first semiconductor device is disposed on a first surface of the circuit board, and the third semiconductor device is disposed on a second surface of the circuit board, or the first semiconductor device and the third semiconductor device are disposed laterally on a same surface of the circuit board.

In some embodiments, the first ESD protection unit comprises a first ESD protection element, a second ESD protection element, and a control circuit. The first ESD protection element is coupled between the first electrical contact and a voltage terminal, wherein the voltage terminal is coupled to a ground or a power voltage. The control circuit is coupled in series with the second ESD protection element between the first operation electrical contact and the ground.

In some embodiments, the control circuit comprises a switch, and the first logic circuit is configured to turn on or turn off the switch for adjusting the capacitance of the first ESD protection unit.

In some embodiments, the control circuit comprises a fuse, and the first logic circuit is configured to burn out the fuse to decrease the capacitance of the first ESD protection unit.

Another aspect of the present disclosure provides an ESD protection method for a first semiconductor device. The first semiconductor device comprises a substrate, an operation solder structure disposed on a first surface of the substrate, and a first semiconductor chip disposed on a second surface of the substrate. The method comprises forming an ESD protection unit in the first semiconductor chip, wherein the ESD protection unit is coupled between a voltage terminal and an operation electrical contact of the first semiconductor chip coupled to the operation solder structure through the substrate, and the voltage terminal is coupled to a ground or a power voltage, coupling the first semiconductor device to a circuit board, transmitting an operation signal to the operation solder structure through the circuit board, and adjusting capacitance of the ESD protection units according to a total quantity of semiconductor chips that receive the operation signal and operate in parallel.

In some embodiments, the ESD protection unit comprises a plurality of ESD protection elements coupled between the operation electrical contact and the voltage terminal, and adjusting the capacitance of the ESD protection units according to the total quantity of semiconductor chips that receive the operation signal and operate in parallel with the first semiconductor chip comprises uncoupling at least one of the plurality of ESD protection elements from the operation electrical contact or the voltage terminal.

In some embodiments, one of the semiconductor chips that receive the operation signal and operate in parallel with the first semiconductor chip is in the first semiconductor device or a second semiconductor device coupled to the first semiconductor device through the circuit board.

In some embodiments, the first semiconductor device and the second semiconductor device comprise memory circuits of different ranks.

Since the semiconductor device, the electronic system, and the ESD protection method for the semiconductor device thereof can adjust capacitance of ESD protection units according to the quantity of semiconductor chips that are coupled together for parallel operations, signal distortion caused by capacitance of the ESD protection units can be mitigated.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
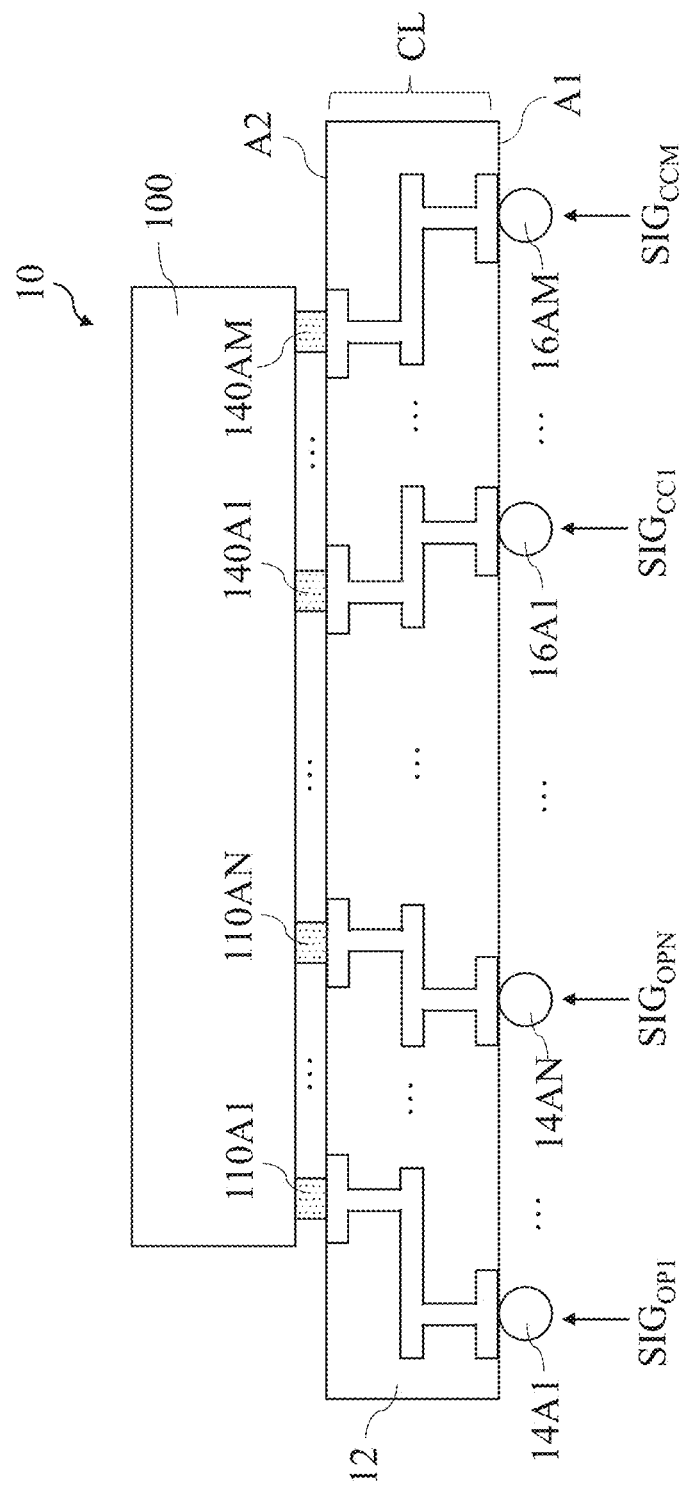
FIG. 1 shows a semiconductor device according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

FIG. 1 shows a semiconductor device 10 according to one embodiment of the present disclosure. The semiconductor device 10 includes a substrate 12, operation solder structures 14A1 to 14AN, detection solder structures 16A1 to 16AM, and a semiconductor chip 100, where N and M are positive integers. In some embodiments, N and M can be 1, and the semiconductor device 10 may include one operation solder structure 14A1 and one detection solder structure 16A1. The operation solder structures 14A1 to 14AN can receive operation signals $SIG_{OP1}$ to $SIG_{OPN}$, and the detection solder structures 16A1 to 16AM can receive chip connection signals $SIG_{CC1}$ to $SIG_{CCM}$.

As shown in FIG. 1, the operation solder structures 14A1 to 14AN and the detection solder structures 16A1 to 16AM are disposed on a first surface A1 of the substrate 12 and the semiconductor chip 100 is disposed on a second surface A2 of the substrate 12. In the present embodiment, the substrate 12 includes internal conductive layers CL (or redistribution layers) for coupling the semiconductor chip 100 to the operation solder structures 14A1 to 14AN and the detection solder structures 16A1 to 16AM so that the semiconductor chip 100 can receive the operation signals $SIG_{OP1}$ to $SIG_{OPN}$ and the chip connection signals $SIG_{CC1}$ to $SIG_{CCM}$ for corresponding operations. That is, the substrate 12 can be a package carrier, and the operation solder structures 14A1 to 14AN and the detection solder structures 16A1 to 16AM can be solder bumps, solder balls or other types of solder structures so that the semiconductor device 10 can be installed to a printed circuit board by soldering.

Figure 2:
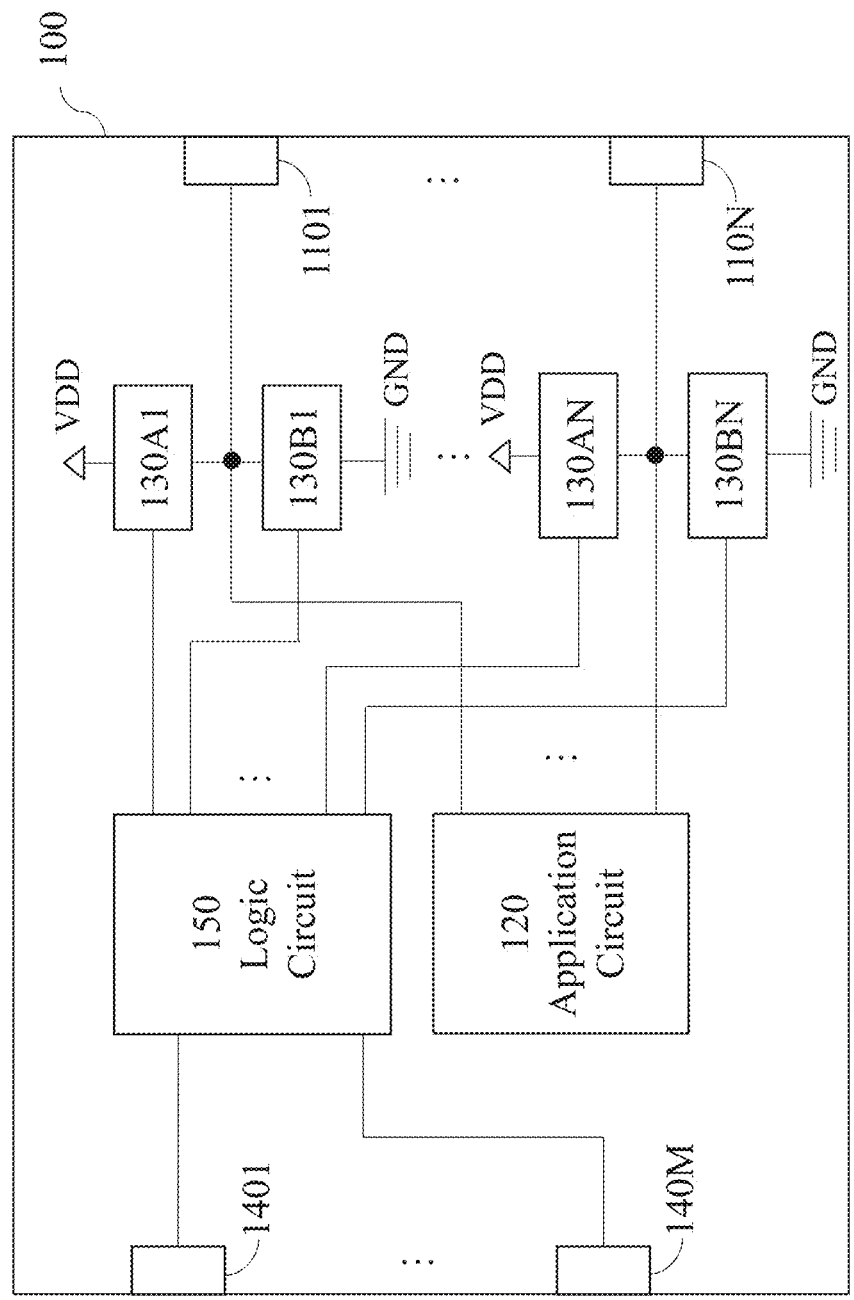
FIG. 2 shows the semiconductor chip in FIG. 1 according to one embodiment of the present disclosure.

FIG. 2 shows the semiconductor chip 100 according to one embodiment of the present disclosure. The semiconductor chip 100 includes operation electrical contacts 1101 to 110N, a memory circuit 120, ESD protection units 130A1 to 130AN and 130B1 to 130BN, detection electrical contacts 1401 to 140M, and logic circuit 150. In some embodiments, N and M can be positive integers, such as 4, 6, or 8. However, the present disclosure is not limited thereto. In some embodiments, N and M can be 1. In such case, the semiconductor chip 100 includes one operation electrical contact 1101, one ESD protection unit 130A1, one ESD protection unit 130B1, and one detection electrical contact 1401.

The operation electrical contacts 1101 to 110N and the detection electrical contacts 1401 to 140M can be pins, solder pads, micro bumps or other types of contact structure for connection to the substrate 12. In addition, as shown in FIG. 1, each of the operation electrical contacts 1101 to 110N can be coupled to a corresponding operation solder structure of the operation solder structures 14A1 to 14AN through the substrate 12 for receiving an operation signal, and each of the detection electrical contacts 1401 to 140M can be coupled to a corresponding detection solder structure of the detection solder structures 16A1 to 16AM through the substrate 12 for receiving a chip connection signal.

The memory circuit 120 can perform operations according to signals received by the operation electrical contacts 1101 to 110N. For example, the memory circuit 120 can be a dynamic random access memory (DRAM) circuit. In such case, the operation electrical contacts 1101 to 110N may receive read/write commands, addresses or data corresponding to the commands, and the memory circuit 120 can perform read operations or write operations according to the commands, and transmit the requested data accordingly.

Since the operation electrical contacts 1101 to 110N are used for external connection, ESD protection units 130A1 to 130AN and 130B1 to 130BN are coupled to the operation electrical contacts 1101 to 110N for providing discharge paths at the electrical contacts 1101 to 110N, thereby preventing the discharge currents from damaging the memory circuit 120. As shown in FIG. 2, each of the ESD protection units 130A1 to 130AN is coupled to a corresponding electrical contact of the operation electrical contacts 1101 to 110N and the ground GND, and each of the ESD protection units 130B1 to 130BN is coupled to a corresponding electrical contact of the operation electrical contacts 1101 to 110N and the power voltage VDD. For example, the ESD protection unit 130A1 is coupled between the operation electrical contact 1101 and the ground GND, the ESD protection unit 130B1 is coupled between the operation electrical contact 1101 and the power voltage VPP, the ESD protection unit 130AN is coupled between the operation electrical contact 110N and the ground GND, and the ESD protection unit 130BN is coupled between the operation electrical contact 110N and the power voltage VDD. However, the present disclosure is not limited thereto. In some embodiments, the semiconductor chip 100 may omit some of the ESD protection units 130A1 to 130AN and 130B1 to 130BN according to system needs. For example, the semiconductor chip 100 may omit the ESD protection units 130A1 to 130AN, omit the ESD protection units 130B1 to 130BN, or omit some of ESD protection units 130A1 to 130AN and some of ESD protection units 130B1 to 130BN.

Since the ESD protection units 130A1 to 13A0N and 130B1 to 130BN are capacitive, operation signals $SIG_{OP1}$ to $SIC_{OPN}$ received by the operation electrical contacts 1101 to 110N need to charge or discharge the equivalent capacitors or parasitic capacitors of the ESD protection units 130A1 to 13A0N and 130B1 to 130BN before the memory circuit 120 can sense the signals correctly. That is, the signals are distorted due to the capacitance of the ESD protection units 130A1 to 13A0N and 130B1 to 130BN. Furthermore, in some embodiments, the semiconductor chip 100 may be coupled to other semiconductor chips and may receive the same signals with those semiconductor chips to perform operations in parallel. For example, if the semiconductor chip 100 and the other semiconductor chips (e.g., other semiconductor chips disposed in the semiconductor device 10 or the other semiconductor chips disposed in other semiconductor devices that are not shown in FIG. 1) are corresponding to different ranks of the same memory system, the semiconductor chip 100 and those semiconductor chips would receive the same signals and perform read/write operations in parallel. In such case, signals sent to the operation electrical contacts of the semiconductor chip 100 and those semiconductor chips will have to charge the equivalent capacitors of the ESD protection units of all the semiconductor chips. Therefore, distortion of signals become even severe.

To mitigate such distortion, when the semiconductor chip 100 is coupled to other semiconductor chips, the semiconductor chip 100 can receive chip connection signals $SIG_{CC1}$ to $SIG_{CCM}$ through the detection electrical contact 1401 to 140M, so that the semiconductor chip 100 can be notify of the existence of other connected chips. As a result, the logic circuit 150 coupled to the detection electrical contacts 1401 to 140M can adjust capacitance of the ESD protection units 1301 to 130A according to the chip connection signals $SIG_{CC1}$ to $SIG_{CCM}$ received by the detection electrical contacts 1401 to 140M. That is, the logic circuit 150 can be aware of the quantity of the semiconductor chips being coupled to the semiconductor chip 100 according to the chip connection signals $SIG_{CC1}$ to $SIG_{CCM}$, and adjust the capacitance of the ESD protection units 1301 to 130A according to the quantity of semiconductor chips being coupled to the semiconductor chip 100. For example, in some embodiments, the signals $SIG_{CC1}$ to $SIG_{CCM}$ may be used as M binary bits for representing the quantity of the semiconductor chips being coupled to the semiconductor chip 100, and the logic circuit 150 can decode the chip connection signals $SIG_{CC1}$ to $SIG_{CCM}$ to obtain the quantity of the semiconductor chips and adjust the capacitance of the ESD protection units 130A1 to 130AN and 130B1 to 130BN accordingly.

Figure 3:
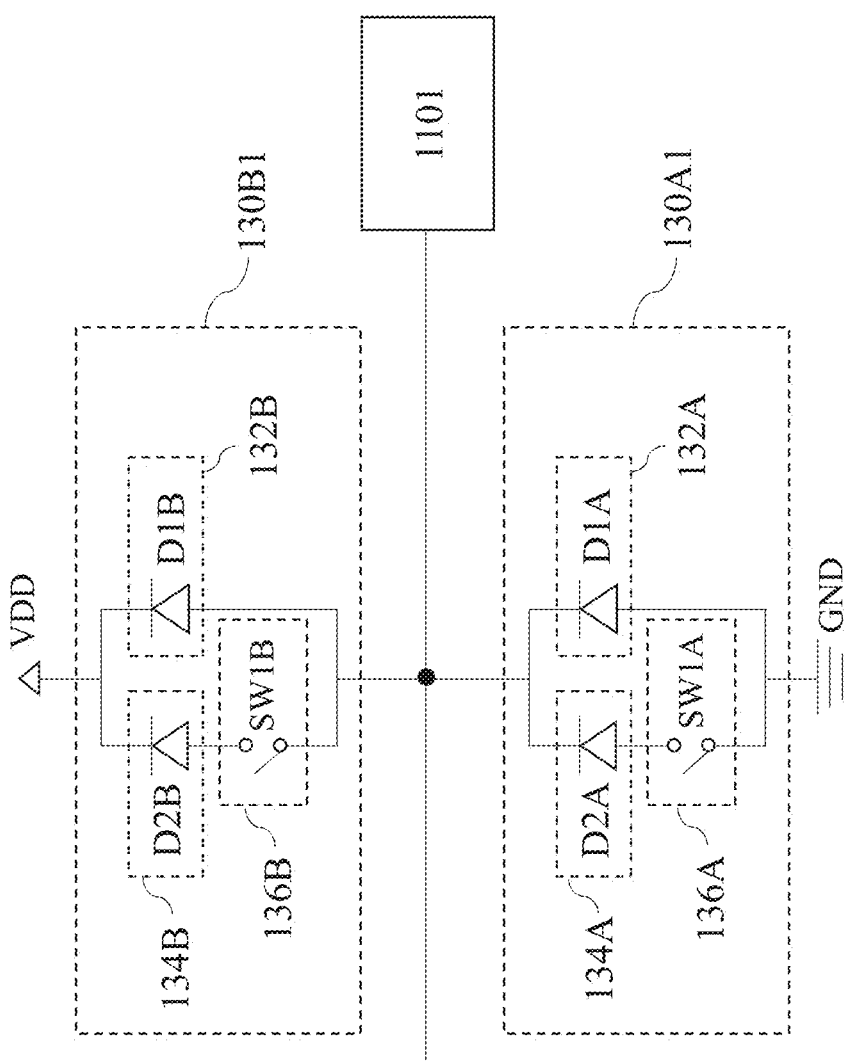
FIG. 3 shows the ESD protection units in FIG. 2 according to another embodiment of the present disclosure.

FIG. 3 shows the ESD protection units 130A1 and 130B1 according to one embodiment of the present disclosure. In the present embodiments, the ESD protection units 130A1 to 13A0N and 130B1 to 130BN can have the same structures. As shown in FIG. 3, the ESD protection unit 130A1 includes a first ESD protection element 132A, a second ESD protection element 134A, and a control circuit 136A.

The first ESD protection element 132A is coupled between the operation electrical contact 1101 and the ground GND, and the second ESD protection element 134A is coupled between the operation electrical contact 1101 and the ground GND. As shown in FIG. 3, the first ESD protection element 132A includes a diode D1. The diode D1A has an anode coupled to the ground GND, and a cathode coupled to the operation electrical contact 1101. Similarly, the second ESD protection element 134A also includes a diode D2A. The diode D2A has an anode coupled to the ground GND, and a cathode coupled to the operation electrical contact 1101.

In some embodiments, the first ESD protection element 132A has first capacitance, and the second ESD protection element 134A has second capacitance. Since the first ESD protection element 132A and the second ESD protection element 134A are coupled in parallel between the operation electrical contact 1101 and the ground GND, the equivalent capacitance of the ESD protection unit 130A1 is substantially the sum of the first capacitance of the first ESD protection element 132A and the second capacitance of the second ESD protection element 134A. In the present embodiment, to allow the logic circuit 150 to adjust the capacitance of the ESD protection unit 130A1, the control circuit 136A can be coupled in series with the second ESD protection element 134A between the operation electrical contact 1101 and the ground GND. As shown in FIG. 3, the control circuit 136A includes a switch SW1A. In such case, the logic circuit 150 can turn off the switch SW1A to uncouple the second ESD protection element 134A from the operation electrical contact 1101 or the ground GND, so the second ESD protection element 134A will no longer be used to provide discharge paths between the operation electrical contact 1101 and the ground GND, and the capacitance of the first ESD protection unit 130A1 is decreased. That is, by turning on or turning off the switch SW1A, the logic circuit 150 is able to adjust the capacitance of the first ESD protection unit 130A1 according to system requirements.

Similarly, the ESD protection unit 130B1 includes a first ESD protection element 132B, a second ESD protection element 134B, and a control circuit 136B. The first ESD protection element 132B is coupled between the operation electrical contact 1101 and the power voltage VDD, and the second ESD protection element 134B is coupled in series with the control circuit 136B between the operation electrical contact 1101 and the power voltage VDD. As shown in FIG. 3, the first ESD protection element 132B includes a diode D1B, and the second ESD protection element 134A includes a diode D2B. The anodes of diodes D1 and D2 are coupled to the operation electrical contact 1101, and the cathodes of the diodes D1 and D2 are coupled to the power voltage VPP. That is, the ESD protection elements 132B and 134B can be used to provide discharge paths between the operation electrical contact 1101 and the power voltage VDD. Furthermore, the logic circuit 150 can turn on or turn off the switch SW1B of the control circuit 136B to adjust the capacitance of the ESD protection unit 130B1 according to system requirements.

In some embodiments, in the ESD protection units 130A1 and 130B1, the diodes D1A and D1B may have the same sizes as the diodes D2A and D2B. In such case, the first capacitance of the first ESD protection element 132A can be substantially equal to the second capacitance of the second ESD protection element 134A. However, the present disclosure is not limited thereto. In some other embodiments, the diodes D1A and D2A may have different sizes, and the first capacitance of the first ESD protection element 132A can be different from the second capacitance of the second ESD protection element 134A. Furthermore, in some other embodiments, the first ESD protection elements 132A, 134A, 132B, and 132B may include other types of components, such as capacitors, resistors, and/or transistors.

Figure 4:
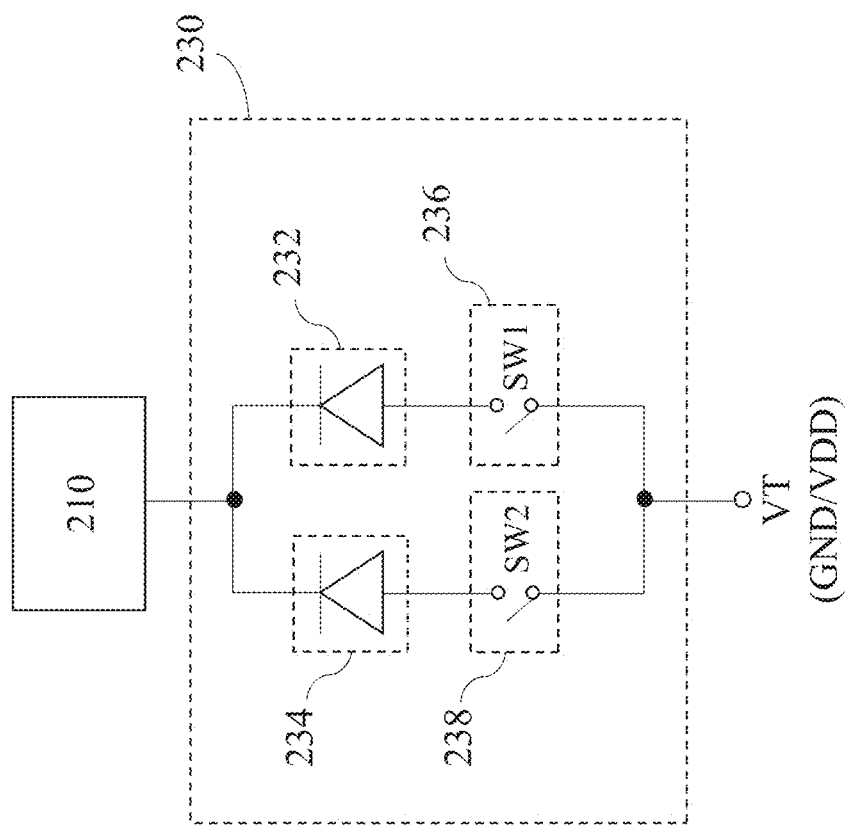
FIG. 4 shows an ESD protection unit according to another embodiment of the present disclosure.

FIG. 4 shows an ESD protection unit 230 according to one embodiment of the present disclosure. In some embodiments, the ESD protection unit 230 can be used to replace the ESD protection units 130A1 to 130AN and 130B1 to 130BN in the semiconductor chip 100. As shown in FIG. 4, the ESD protection unit 230 includes a first ESD protection element 232, a second ESD protection element 234, a first control circuit 236 and a second control circuit 238. The first control circuit 236 is coupled in series with the first ESD protection element 232 between an operation electrical contact 210 and a voltage terminal VT. In some embodiments, the voltage terminal VT can be coupled to the ground GND or the power voltage VDD. The second control circuit 238 is coupled in series with the second ESD protection element 234 between the operation electrical contact 210 and the voltage terminal VT. In addition, the capacitance of the first ESD protection element 232 and the capacitance of the second ESD protection element 234 can be different. In the case that each of the ESD protection units 130A1 to 130AN and 130B1 to 130BN is replaced by the ESD protection unit 230, the manufacturer may decide to turn off the switch SW1 of the first control circuit 236 or the switch SW2 of the second control circuit 238 for providing the ESD protection with the desired capacitance according to requirements. In some embodiments, the ESD protection unit 230 may further include more ESD protection elements and control circuits so as to provide more options of capacitance.

Figure 5:
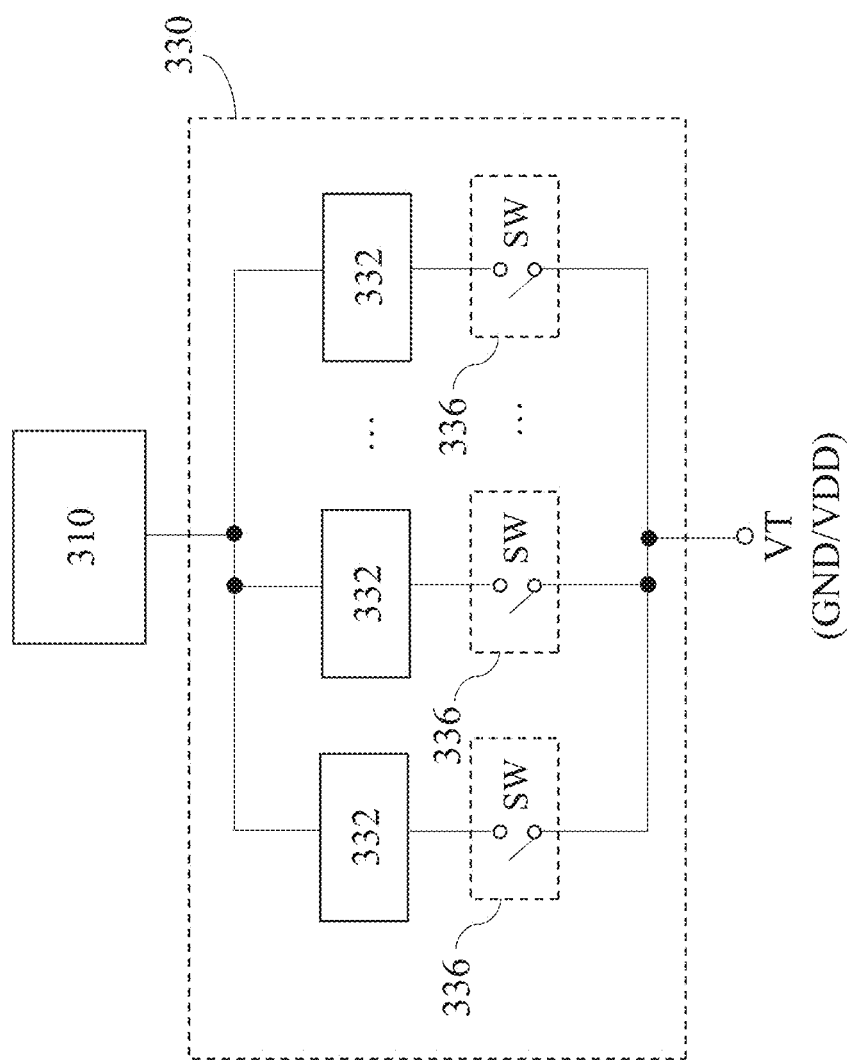
FIG. 5 shows an ESD protection unit according to another embodiment of the present disclosure.

FIG. 5 shows an ESD protection unit 330 according to another embodiment of the present disclosure. In the present embodiments, the ESD protection unit 330 can be used to implement the ESD protection units 130A1 to 130AN and 130B1 to 130BN of the semiconductor chip 100. As shown in FIG. 5, the ESD protection unit 330 includes a plurality of ESD protection elements 332, and a plurality of control circuits 336. Each of the ESD protection element 332 is coupled in series with a control circuit 336 between the operation electrical contact 310 and the voltage terminal VT. In such case, by turning on different quantity of switches SW of the control circuits 336, the ESD protection unit 330 can be adjusted to have different capacitance. That is, by including more ESD protection elements 332 and control circuits 336, it allows the ESD protection unit 330 to provide more options of different capacitances.

Figure 6:
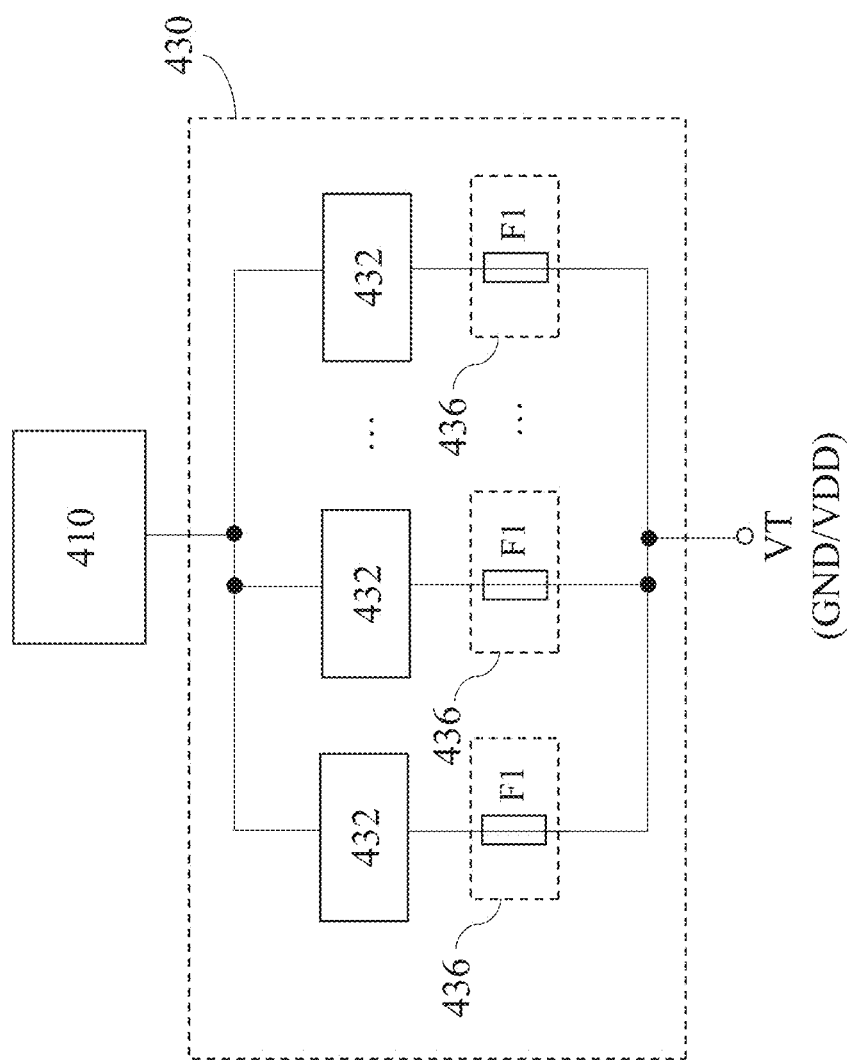
FIG. 6 shows an ESD protection unit according to another embodiment of the present disclosure.

In some embodiments, the control circuit can include switch that can be turned on or turned off. However, the present disclosure is not limited thereto. In some embodiment, the control circuit may include fuses. FIG. 6 shows an ESD protection unit 430 according to another embodiment of the present disclosure. In the present embodiments, the ESD protection unit 430 can be used to implement the ESD protection units 130A1 to 130AN and 130B1 to 130BN of the semiconductor chip 100. As shown in FIG. 6, the ESD protection unit 430 includes a plurality of ESD protection elements 432, and a plurality of control circuits 436. Each of the ESD protection element 432 is coupled in series with a control circuit 436 between the operation electrical contact 410 and the ground GND. In such case, by burning out different quantities of fuses F1 of the control circuits 436, the ESD protection unit 430 can be adjusted to have different capacitance. In some embodiments, the semiconductor chip 100 may further include other circuits or components (not shown in FIG. 6) for controlling the fuses F1 of the control circuits 436 so that the fuses F1 can be burned without damaging other components in the semiconductor chip 100.

Figure 7:
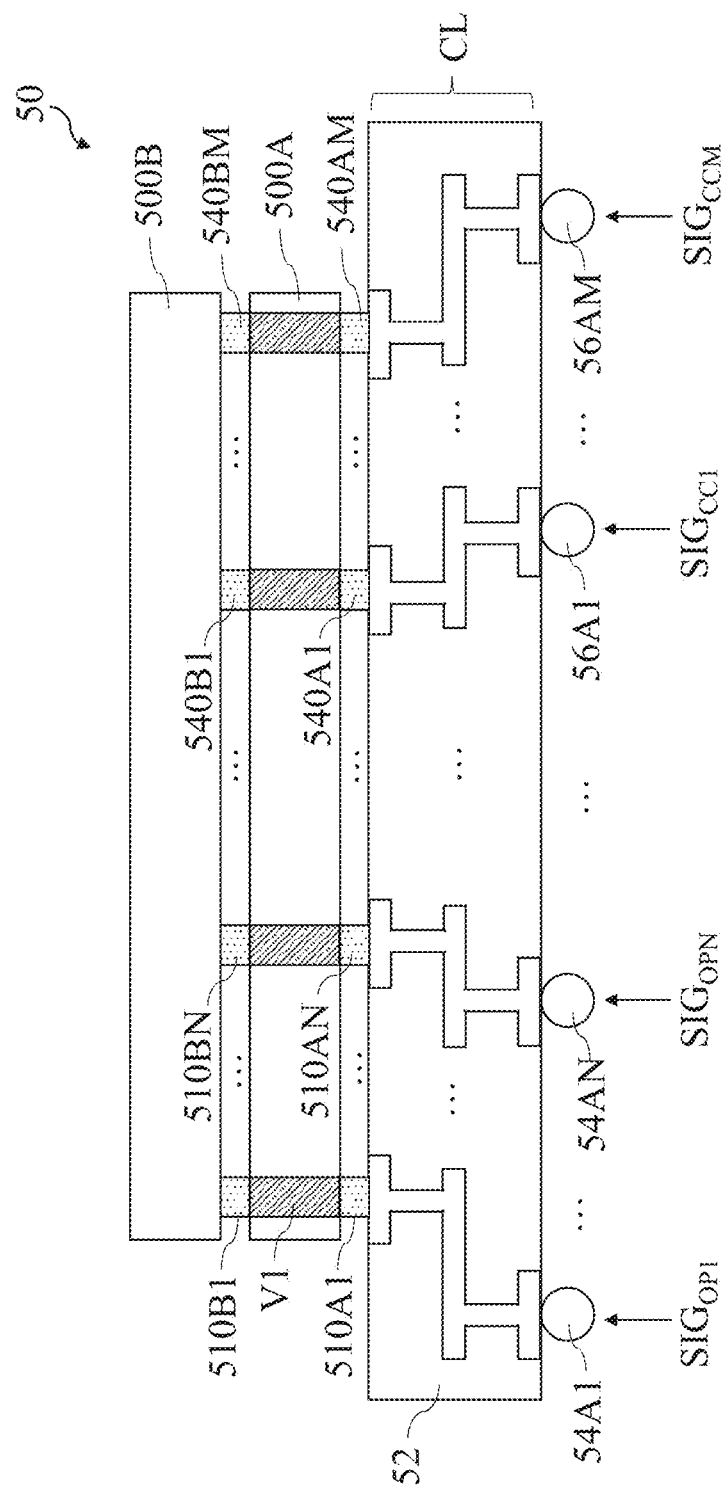
FIG. 7 shows a semiconductor device according to another embodiment of the present disclosure.

FIG. 7 shows a semiconductor device 50 according to one embodiment of the present disclosure. The semiconductor device 50 includes a substrate 52, operation solder structures 54A1 to 54AN, detection solder structures 56A1 to 56AM, a first semiconductor chip 500A and a second semiconductor chip 500B. The operation solder structures 54A1 to 54AN can receive operation signals $SIG_{OP1}$ to $SIG_{OPN}$, and the detection solder structures 56A1 to 56AM can receive chip connection signals $SIG_{CC1}$ to $SIG_{CCM}$. In addition, the first operation electrical contacts 510A1 to 510AN of the first semiconductor chip 500A and the second operation electrical contacts 510B1 to 510BN of the second semiconductor chip 500B can be coupled to the operation solder structures 54A1 to 54AN for receiving the operation signals $SIG_{OP1}$ to $SIG_{OPN}$. Also, the first detection electrical contacts 540A1 to 540AM of the first semiconductor chip 500A and the second detection electrical contacts 540B1 to 540BM of the second semiconductor chip 500B can be coupled to the detection solder structures 56A1 to 56AM for receiving the chip connection signals $SIG_{CC1}$ to $SIG_{CCM}$.

Furthermore, as shown in FIG. 7, the first semiconductor chip 500A is disposed on the substrate 52, and the second semiconductor chip 500B is stacked on the first semiconductor chip 500A. In the present embodiments, each of the second operation electrical contacts 510B1 to 510BN can be coupled to a corresponding one of the first operation electrical contacts 510A1 to 510AN by a through silicon via (TSV) V1. However, the present disclosure is not limited thereto. For example, in some other embodiments, the second semiconductor chip 500B may be stacked on the first semiconductor chip 500A without covering the first operation electrical contacts 510A1 to 510AN so the second operation electrical contacts 510B1 to 510BN can be coupled to the first operation electrical contacts 510A1 to 510AN by wiring bonding. However, the present disclosure does not limit that the first semiconductor chip 500A and the second semiconductor chip 500B are stacked. In some other embodiments, the first semiconductor chip 500A and the second semiconductor chip 500B may be placed laterally near to each other on a same surface of a substrate.

Figure 8:
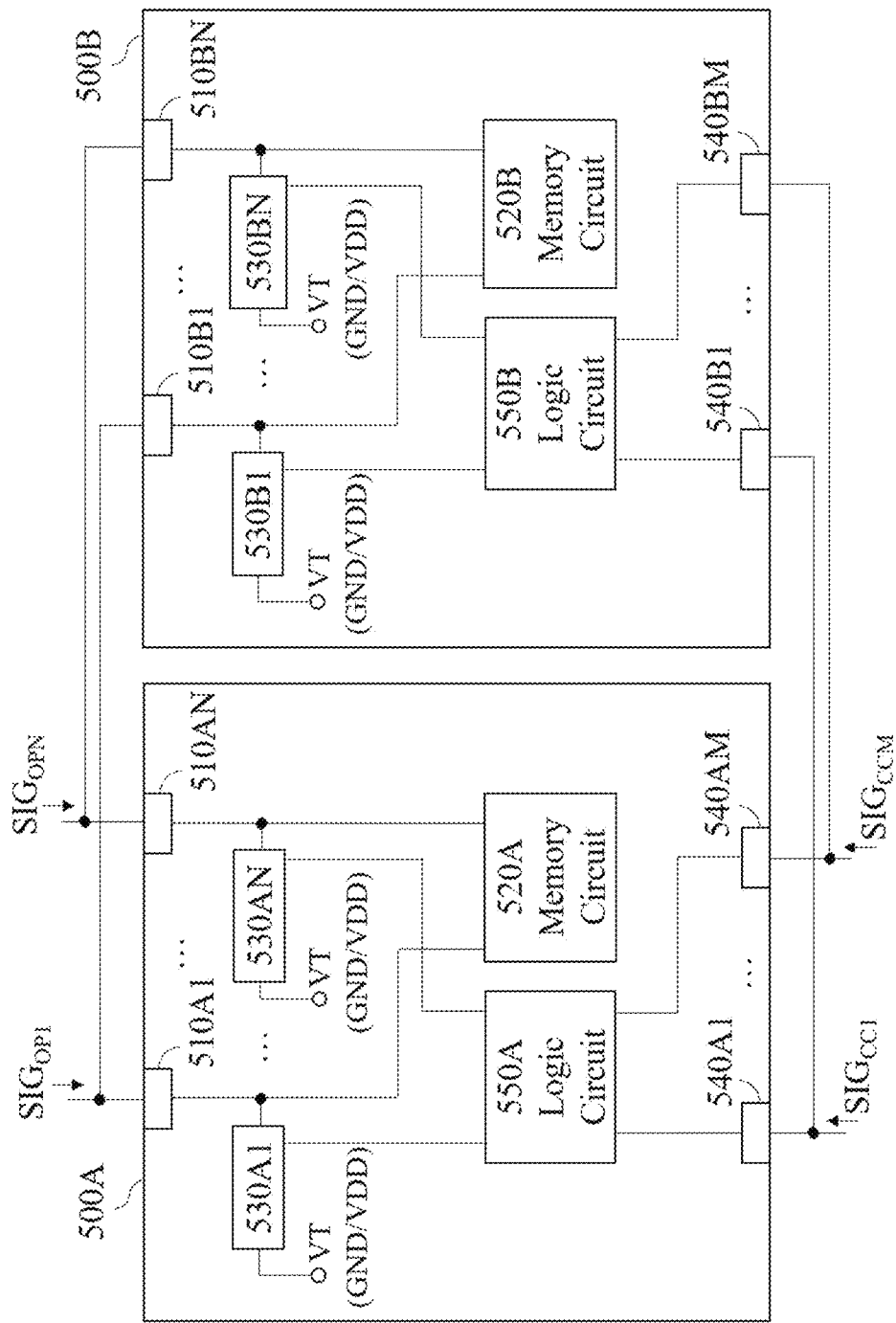
FIG. 8 shows the semiconductor chips in FIG. 7 according to one embodiment.

FIG. 8 shows the semiconductor chip 500A and the semiconductor chip 500B according to one embodiment of the present disclosure. In the present embodiment, the semiconductor chip 500A and the semiconductor chip 500B can have the same structure. For example, as shown in FIG. 8, the first semiconductor chip 500A includes first operation electrical contacts 510A1 to 510AN, a first memory circuit 520A, first ESD protection units 530A1 to 530AN, first detection electrical contacts 540A1 to 540AM, and a first logic circuit 550A. Also, the second semiconductor chip 500B includes second operation electrical contacts 510B1 to 510BN, a second memory circuit 520B, second ESD protection units 530B1 to 530BN, second detection electrical contacts 540B1 to 540BM, and a second logic circuit 550B.

In the present embodiment, the semiconductor device 50 can be a memory device, and the first memory circuit 520A and the second memory circuit 520B can be DRAM circuits that are combined to provide a wider bandwidth and a larger memory space for the semiconductor device 50. In such case, the first operation electrical contacts 510A1 to 510AN and the second operation electrical contacts 510B1 to 510BN can receive the same operation signals $SIG_{OP1}$ to $SIG_{OPN}$, and the memory circuits 520A and 520B can operate in parallel according to the operation signals $SIG_{OP1}$ to $SIG_{OPN}$. In addition, since the first ESD protection unit 530A1 and the second ESD protection unit 530B1 are capacitive, the signal $SIG_{OP1}$ needs to charge the equivalent capacitors or the parasitic capacitors of the first ESD protection unit 530A1 and the second ESD protection unit 530B1 before the actual voltage of the signal $SIG_{OP1}$ can be sensed by the first memory circuit 520A and the second memory circuit 520B. Therefore, the signal $SIG_{OP1}$ is distorted due to the capacitance of the first ESD protection unit 530A1 and the second ESD protection unit 530B1.

To mitigate the distortion of the signal $SIG_{OP1}$, the capacitance of the first ESD protection unit 530A1 and the second ESD protection unit 530B1 can be adjusted. For example, the first ESD protection unit 530A1 and the second ESD protection unit 530B1 can have the same structure as the structure of the ESD protection unit 130A1 shown in FIG. 3. In such case, the logic circuit 550A can turn off the switch in the first ESD protection unit 530A1 and the logic circuit 550B can turn off the switch in the second ESD protection unit 530B1, so the capacitance of each of the first ESD protection unit 530A1 and the second ESD protection unit 530B1 can be reduced. In some embodiments, the chip connection signals $SIG_{CC1}$ to $SIG_{CCM}$ can be used to notify the logic circuits 520A and 520B of the total quantity of semiconductor chips that are coupled together for parallel operations. Since the distortion of the operation signals $SIG_{OP1}$ to $SIG_{OPN}$ are related to the total quantity semiconductor chips that are coupled together for parallel operations, the logic circuits 520A and 520B can adjust the capacitance of the ESD protection units 530A1 to 530AN and 530B1 to 530BN according to the chip connection signals $SIG_{CC1}$ to $SIG_{CCM}$.

Furthermore, the present disclosure does not limit to implement the first ESD protection units 530A1 to 530AN and the second ESD protection units 530B1 to 530BN with the ESD protection unit 130A1 shown in FIG. 3. In some other embodiments, the ESD protection unit 230 shown in FIG. 4, the ESD protection unit 330 shown in FIG. 5, or the ESD protection unit 430 shown in FIG. 6 can be adopted to implement the first ESD protection units 530A1 to 530AN and the second ESD protection units 530B1 to 530BN according to system requirements. Moreover, to provide discharging paths to both the ground GND and the power voltage VDD, the first semiconductor chip 500A and the second semiconductor chip 500B may include more ESD protection units so that each of the electrical contacts 510A1 to 510AN and 510B1 to 510B1 can be protected by two ESD protection units, one coupled to the ground GND and another coupled the power voltage VDD, which is similar to the semiconductor chip 100 shown in FIG. 2.

In some embodiments, in addition to the semiconductor chips 500A and 500B, the semiconductor device 50 may further include more semiconductor chips according to system requirements. Also, in some embodiments, different semiconductor devices may be coupled together so that the semiconductor chips in the different semiconductor devices can receive the same operation signals and operate in parallel.

Figure 9:
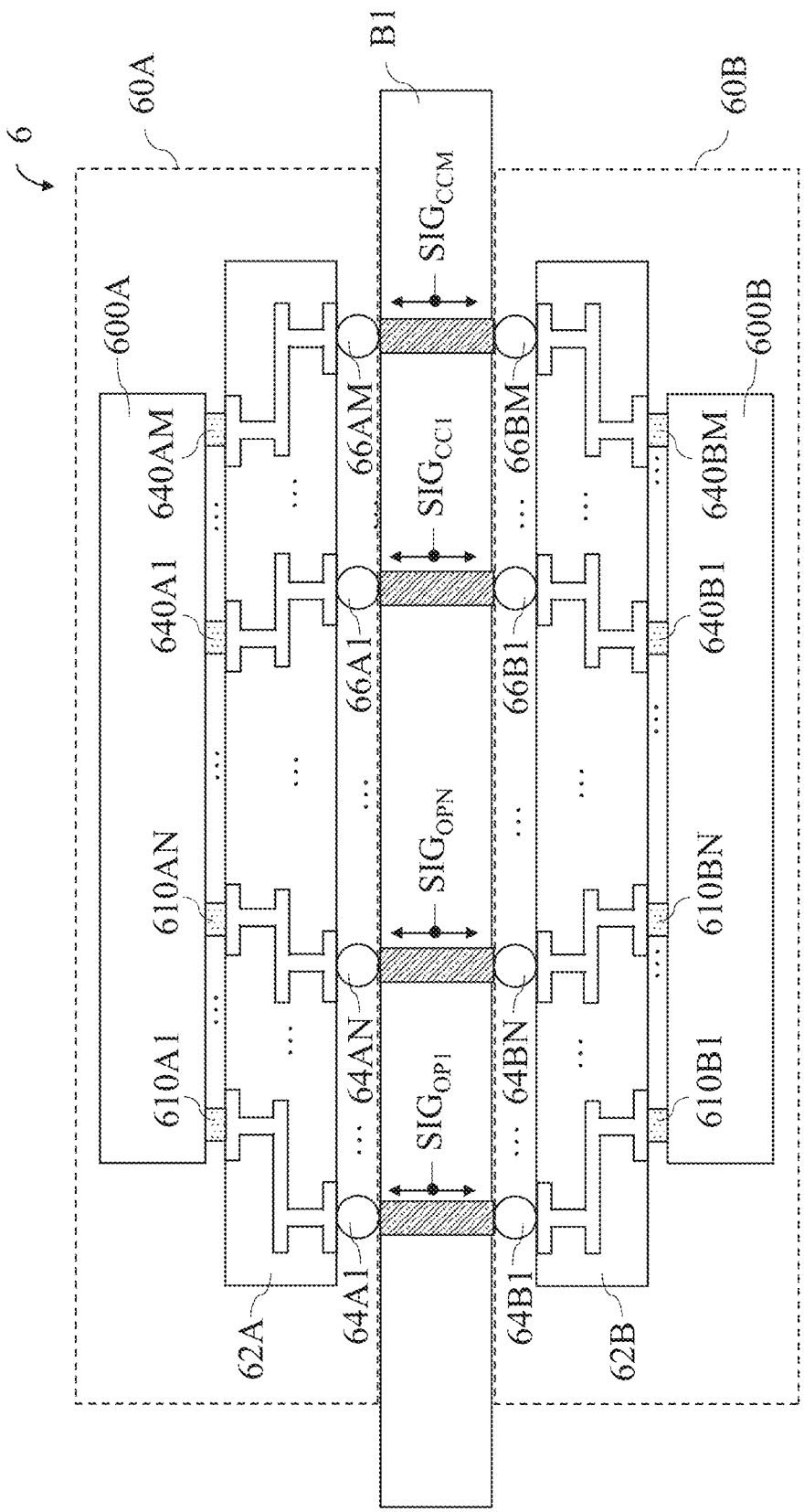
FIG. 9 shows an electronic system according to another embodiment of the present disclosure.

FIG. 9 shows an electronic system 6 according to one embodiment of the present disclosure. The electronic system 6 includes a circuit board B1, a first semiconductor device 60A, and a second semiconductor device 60B. The second semiconductor device 60B can be coupled to the first semiconductor device 60A through the circuit board B1. As shown in FIG. 9, the first semiconductor device 60A is disposed on a first surface of the circuit board B1, and the second semiconductor device 60B is disposed on a second surface of the circuit board B1. That is, the first semiconductor device 60A and the second semiconductor device 60B can be mounted to the circuit board B1 in a back-to-back manner. However, the present disclosure is not limited thereto. In some embodiments, the first semiconductor device 60A and the second semiconductor device 60B can be disposed laterally on a same surface of the circuit board B1.

In the present embodiment, the first semiconductor device 60A and the second semiconductor device 60B can have the same structures. For example, the semiconductor device 10 can be adopted to implement the semiconductor devices 60A and 60B. For example, the first semiconductor device 60A includes a first substrate 62A, first operation solder structures 64A1 to 64AN, first detection solder structures 66A1 to 66AM, and a first semiconductor chip 600A. The first operation solder structures 64A1 to 64AN and the first detection solder structures 66A1 to 66AM are disposed on a first surface of the first substrate 62A, and the first semiconductor chip 600A is disposed on a second surface of the first substrate 62A. Also, the second semiconductor device 60B includes a second substrate 62B, second operation solder structures 64B1 to 64BN, second detection solder structures 66B1 to 66BM, and a second semiconductor chip 600B. The second operation solder structures 64B1 to 64BN and second detection solder structures 66B1 to 66BM are disposed on a first surface of the second substrate 62B, and the second semiconductor chip 600B is disposed on a second surface of the second substrate 62B.

Figure 10:
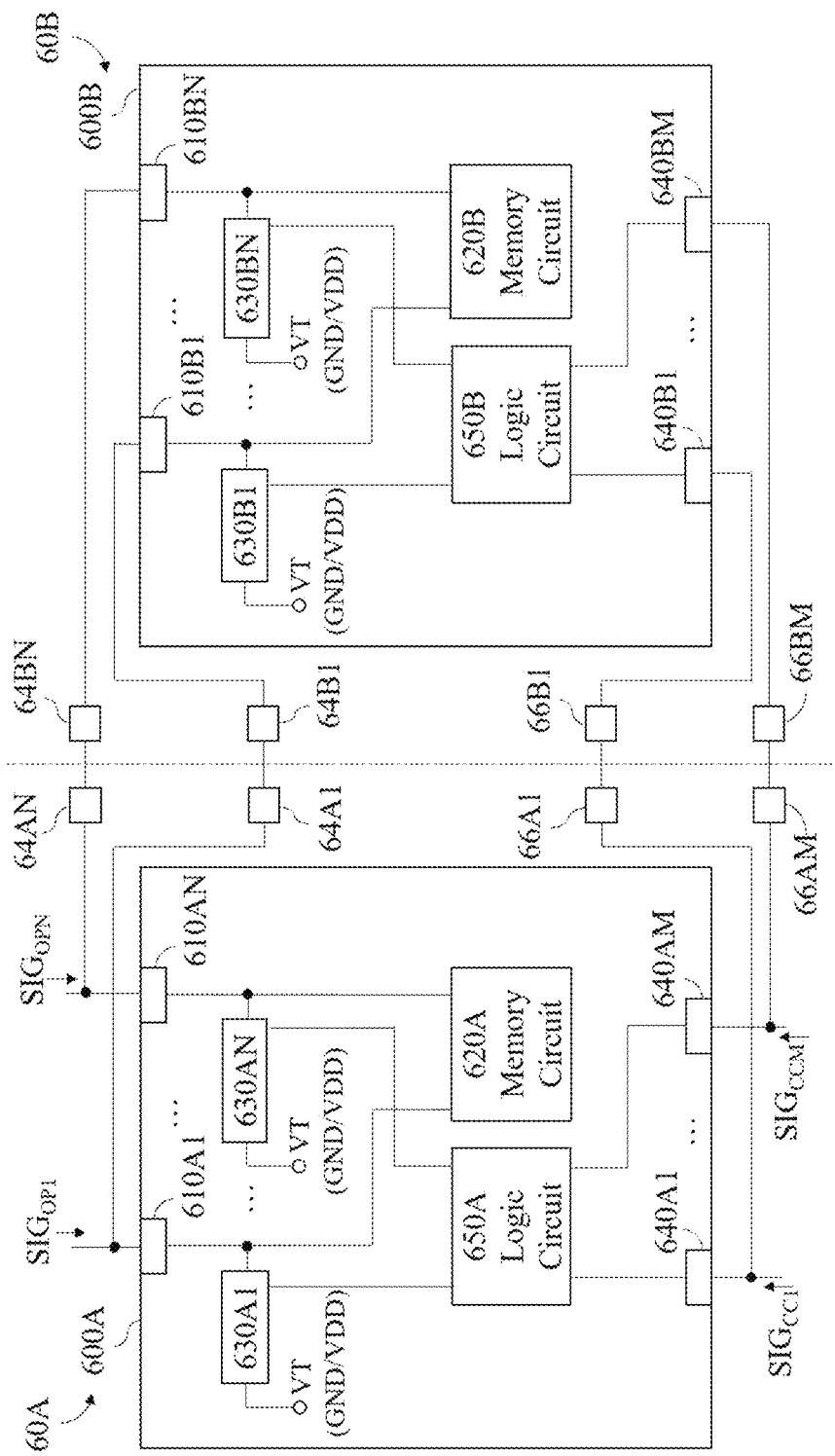
FIG. 10 shows the semiconductor chips in FIG. 9 according to one embodiment of the present disclosure.

In the present embodiments, each of the first operation solder structures 64A1 to 64AN can be coupled to a corresponding one of the second operation solder structures 64B1 to 64BN for receiving the same operation signals $SIG_{OP1}$ to $SIG_{OPN}$, so the circuits in the first semiconductor device 60A and the second semiconductor device 60B can perform operations in parallel accordingly. FIG. 10 shows semiconductor chip 600A in the first semiconductor device 60A and semiconductor chip 600B1 in the second semiconductor device 60B. In the present embodiment, the semiconductor chips 600A and 600B have the same structures as the semiconductor chip 500A as shown in FIG. 8. In such case, the operation electrical contacts 610A1 to 610AN of the semiconductor chip 600A1 are coupled to the operation electrical contacts 610B1 to 610BN of the semiconductor chip 600B1 respectively and correspondingly through the operation solder structures 64A1 to 64AN and 64B1 to 64BN so that the semiconductor chips 600A and 600B can receive the same operation signals $SIG_{OP1}$ to $SIG_{OPN}$. Therefore, the memory circuit 620A of the semiconductor chip 600A, and the memory circuit 620B of the semiconductor chip 600B can perform operations in parallel. In such case, the operation signals $SIG_{OP1}$ to $SIG_{OPN}$ have to charge or discharge the equivalent capacitors or parasitic capacitors of the ESD protection units 630A1 to 30AN and 630B1 to 630BN in the semiconductor chips 600A1 and 600B1, and thus are distorted.

To mitigate the distortion caused by the capacitance of the ESD protection units 630A1 to 630AN, the logic circuit 650A1 can adjust the capacitance of the ESD protection units 630A1 to 630AN of the semiconductor chip 600A according to the chip connection signal $SIG_{CC1}$ to $SIG_{CCM}$ received by the detection electrical contact 640A1 to 640AM through the detection solder structures 66A1 to 66AM. Similarly, the logic circuit 650B can adjust the capacitance of the ESD protection units 630B1 to 630BN of the semiconductor chip 600B according to the chip connection signal $SIG_{CC1}$ to $SIG_{CCM}$ received by the detection electrical contact 640B1 to 640BM through the detection solder structures 66B1 to 66BM. In some embodiments, the chip connection signal $SIG_{CC1}$ to $SIG_{CCM}$ can be transmitted to the semiconductor devices 60A and 60B through the circuit board B1, and can be generated by a control circuit or a processor (not shown in FIG. 9) of the electronic system 6.

Figure 11:
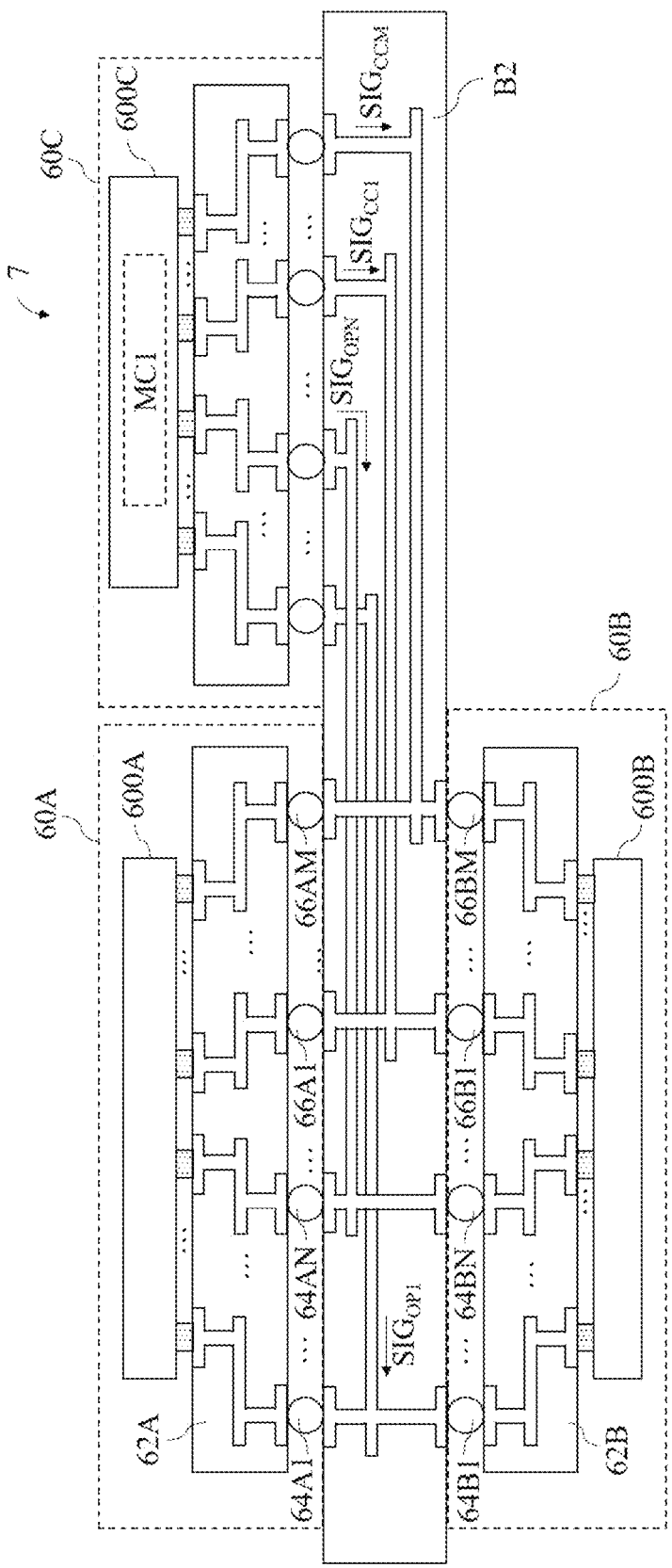
FIG. 11 shows an electronic system according to another embodiment of the present disclosure.

FIG. 11 shows an electronic system 7 according to one embodiment of the present disclosure. The electronic system 7 and the electronic system 6 have similar structures. However, the electronic system 7 further includes a third semiconductor device 60C. While the semiconductor chips 600A and 600B of the semiconductor devices 60A and 60B include memory circuits 620A and 620B as shown in FIG. 10, the third semiconductor device 60C includes a memory controller MC1 for controlling the memory circuits 620A and 620B in the semiconductor chips 600A and 600B. As shown in FIG. 11, the memory controller MC1 can be formed in the semiconductor chip 600C in the third semiconductor device 60C. In such case, since the memory controller MC1 has to be aware of the total quantity of the semiconductor chips 600A and 600B that are coupled together for parallel operations, the memory controller MC1 can also be used to generate the chip connection signals $SIG_{CC1}$ to $SIG_{CCM}$. As shown in FIG. 11, the third semiconductor device 60C can be coupled to the first semiconductor device 60A and the second semiconductor device 60B through the circuit board B2, so the first semiconductor device 60A and the second semiconductor device 60B can receive the operation signals $SIG_{OP1}$ to $SIG_{OPN}$ and the chip connection signals $SIG_{CC1}$ to $SIG_{CCM}$ transmitted by the third semiconductor device 60C, and can thus perform operations and adjust the capacitance of the ESD protection units 630A1 to 630AN and 630B1 to 630BN accordingly.

In some embodiments, the electronic device 60A and 60B may include more semiconductor chips. For example, the electronic device 50 shown in FIG. 7 may be adopted to replace the electronic device 60A and/or the electronic device 60B. In such cases, since the memory controller MC1 can still be aware of the total quantity of the semiconductor chips in the electronic system 7 that are coupled together for parallel operations, the memory controller MC1 can generate the chip connection signals $SIG_{CC1}$ to $SIG_{CCM}$ accordingly to further decrease the capacitance of the ESD protection units 630A1 to 630AN and 630B1 to 630BN.

Furthermore, as shown in FIG. 11, the third semiconductor device 60C and the first semiconductor device 60A are disposed laterally on a first surface of the circuit board B2, and the second semiconductor device 60B is disposed on a second surface of the circuit boards B2. However, in some other embodiments, the electronic system 7 may include different quantity of semiconductor devices and those semiconductor devices may be arranged in different manners. For example, in some embodiments, the electronic system 7 may omit the second semiconductor device 60B, and the third semiconductor device 60C can be disposed on the second surface of the circuit board B2. That is, the third semiconductor device 60C and the first semiconductor device 60A can be coupled through the circuit board B2 in a back-to-back manner. Furthermore, in such case, since the quantity of semiconductor chips that are coupled together for parallel operations is decreased, the chip connection signals $SIG_{CC1}$ to $SIG_{CCM}$ generated by the memory controller MC1 of the third semiconductor device 60C may also be different from the previous embodiment shown in FIG. 11, so the logic circuits 650A can adjust the capacitance of the ESD protection units 630A1 to 630AN according to the actual situation of chip connection.

Figure 12:
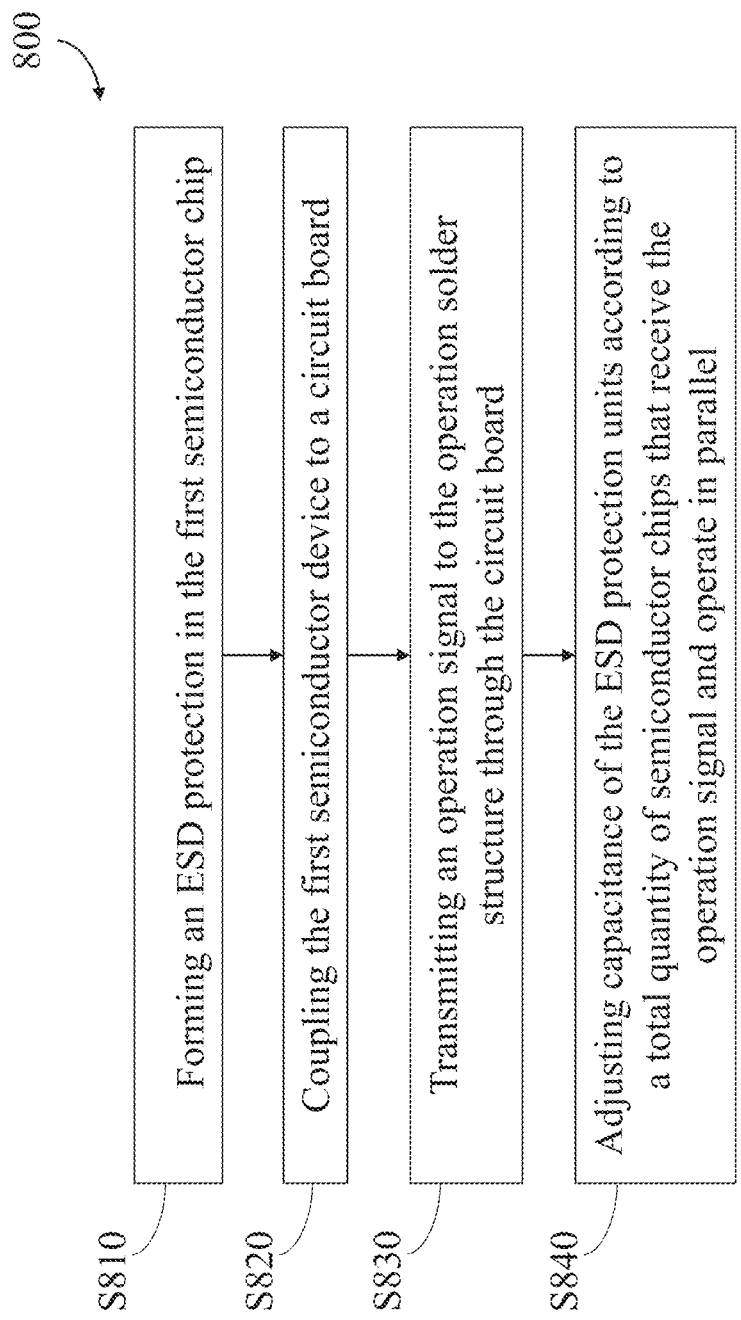
FIG. 12 shows a flow chart of an ESD protection method for a semiconductor device.

FIG. 12 shows a flow chart of an ESD protection method 800 for a semiconductor device. In some embodiments, the method 800 can be applied to the semiconductor device 60A shown in FIG. 9 and FIG. 10. For example, in step S810, the ESD protection units 630A1 to 630AN can be formed in the semiconductor chip 600A of the semiconductor device 60A. As shown in FIG. 10, each of the ESD protection units 630A1 to 630AN is coupled between the voltage terminal VT and a corresponding operation electrical contact of the operation electrical contacts 610A1 to 610AN. The voltage terminal VT can be coupled to the ground GND or the power voltage VDD. In some embodiments, the ESD protection units 630A1 to 630AN can be implemented by adopting the ESD protection unit 130A1 or 130B1 shown in FIG. 3. However, in some other embodiments, the ESD protection units 630A1 to 630AN can be implemented by adopting the ESD protection unit 230 shown in FIG. 4, the ESD protection unit 330 shown in FIG. 5, or the ESD protection unit 430 shown in FIG. 6 according to system requirements.

In addition, in step S820, the first semiconductor device 60A can be coupled to the circuit board B1 as shown in FIG. 9, so the first semiconductor device 60A can be coupled to the second semiconductor device 60B through the circuit board B1. In some embodiments, the first semiconductor device 60A and the second semiconductor device 60B can include memory circuits of different ranks. In such case, the operation signals $SIG_{OP1}$ to $SIG_{OPN}$ can be transmitted to the first semiconductor device 60A and the second semiconductor device 60B through the circuit board B1 in step S830, and the first semiconductor device 60A and the second semiconductor device 60B can perform operations in parallel according to the operation signals $SIG_{OP1}$ to $SIG_{OPN}$.

Furthermore, in step S840, the capacitance of the ESD protection units 630A1 to 630AN of the semiconductor chip 600A can be adjusted according to a total quantity of semiconductor chips that receive the operation signals $SIG_{OP1}$ to $SIG_{OPN}$ and operate in parallel. For example, if each of the ESD protection units 630A1 to 630AN includes a plurality of ESD protection elements coupled between the voltage terminal VT and a corresponding operation electrical contact of the operation electrical contacts 610A1 to 610AN, the logic circuits 650A can uncouple at least one of the ESD protection elements from the corresponding operation electrical contact or the voltage terminal VT by turning off some switches in the ESD protection units 630A1 to 630AN or burning out some fuses in the ESD protection units 630A1 to 630AN. As a result, the capacitance of the ESD protection units 630A1 to 630AN and 630B1 to 630BN of the semiconductor chip 600A can be adjusted.

Furthermore, in the present embodiment, the semiconductor chip that receives the operation signals $SIG_{OP1}$ to $SIG_{OPN}$ and operate in parallel with the first semiconductor chip 600A is in the second semiconductor device 60B and is coupled to the first semiconductor device 60A through the circuit board B1 as shown in FIG. 9. However, in some embodiments, the electronic device 60A may include more than one semiconductor chip. In such case, semiconductor chips in the electronic device 60A would all be included when calculating the total quantity of semiconductor chips that receive the operation signals $SIG_{OP1}$ to $SIG_{OPN}$ and operate in parallel.

In summary, the semiconductor chip, the semiconductor device, and the ESD protection method for the semiconductor device thereof can adjust capacitance of ESD protection units according to system requirements. Therefore, when multiple semiconductor chips are stacked or coupled to together for parallel operations, the signal distortion caused by the capacitance of the ESD protection units of those semiconductor chips can be mitigated, thereby shortening the rise time and the fall time of the signals and improving the transmission quality of the signals.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
an operation solder structure disposed on a first surface of the substrate and configured to receive an operation signal;
a detection solder structure disposed on the first surface of the substrate, and configured to receive a chip connection signal; and
a first semiconductor chip disposed on a second surface of the substrate, and comprising:
a first operation electrical contact coupled to the operation solder structure through the substrate;
a first detection electrical contact coupled to the detection solder structure through the substrate;
a first electrostatic discharge (ESD) protection unit coupled to the first operation electrical contact; and
a first logic circuit coupled to the first detection electrical contact, and configured to adjust a capacitance of the first ESD protection unit according to the chip connection signal.

2. The semiconductor device of claim 1, wherein the first semiconductor chip further comprises:
a memory circuit configured to perform operations according to at least the operation signal.

3. The semiconductor device of claim 1, wherein the first ESD protection unit comprises:
a first ESD protection element coupled between the first operation electrical contact and a voltage terminal;
a second ESD protection element; and
a control circuit coupled in series with the second ESD protection element between the first operation electrical contact and the voltage terminal;
wherein the voltage terminal is coupled to a ground or a power voltage.

4. The semiconductor device of claim 3, wherein the control circuit comprises a switch, and the first logic circuit is configured to turn on or turn off the switch for adjusting the capacitance of the first ESD protection unit.

5. The semiconductor device of claim 3, wherein the control circuit comprises a fuse, and the first logic circuit is configured to burn out the fuse to decrease the capacitance of the first ESD protection unit.

6. The semiconductor device of claim 1, further comprises a second semiconductor chip disposed laterally near the first semiconductor chip on the second surface of the substrate or stacked on the first semiconductor chip, wherein the second semiconductor chip comprises:
a second operation electrical contact coupled to the operation solder structure;
a second detection electrical contact coupled to the detection solder structure;
a second ESD protection unit coupled to the second operation electrical contact; and
a second logic circuit coupled to the second detection electrical contact, and configured to adjust a capacitance of the second ESD protection unit according to the chip connection signal.

7. An electronic system comprising:
a circuit board; and
a first semiconductor device coupled to the circuit board, and comprising:
a first substrate;
a first operation solder structure disposed on a first surface of the first substrate and configured to receive a first operation signal;
a first detection solder structure disposed on the first surface of the first substrate, and configured to receive a first chip connection signal; and
a first semiconductor chip disposed on a second surface of the first substrate, and comprising:
a first operation electrical contact coupled to the first operation solder structure;
a first detection electrical contact coupled to the first detection solder structure;
a first electrostatic discharge (ESD) protection unit coupled to the first operation electrical contact; and a first logic circuit coupled to the first detection electrical contact, and configured to adjust a capacitance of the first ESD protection unit according to at least the first chip connection signal.

8. The electronic system of claim 7, wherein the first semiconductor device further comprises a second semiconductor chip disposed laterally near the first semiconductor chip on the second surface of the first substrate or stacked on the first semiconductor chip, wherein the second semiconductor chip comprises:
   a second operation electrical contact coupled to the first operation solder structure;
   a second detection electrical contact coupled to the first detection solder structure;
   a second ESD protection unit coupled to the second operation electrical contact; and
   a second logic circuit coupled to the second detection electrical contact, and configured to adjust a capacitance of the second ESD protection unit according to the first chip connection signal.

9. The electronic system of claim 7, further comprising a second semiconductor device coupled to the first semiconductor device through the circuit board, wherein:
   a structure of the second semiconductor device is same as a structure of the first semiconductor device;
   the second semiconductor device and the first semiconductor device is configured to receive the first operation signal and perform operations in parallel accordingly; and
   a second logic circuit of a second semiconductor chip in the second semiconductor device is configured to adjust a capacitance of a third ESD protection unit of the second semiconductor chip according to the first chip connection signal.

10. The electronic system of claim 9, wherein:
    the first semiconductor device is disposed on a first surface of the circuit board, and the second semiconductor device is disposed on a second surface of the circuit board; or
    the first semiconductor device and the second semiconductor device are disposed laterally on a same surface of the circuit board.

11. The electronic system of claim 7, wherein the first semiconductor chip further comprises:
    a memory circuit configured to perform operations according to at least the first operation signal.

12. The electronic system of claim 11, further comprising a second semiconductor device coupled to the first semiconductor device through the circuit board, wherein the second semiconductor device comprises a memory controller configured to control the memory circuit in the first semiconductor chip and generate the first chip connection signal.

13. The electronic system of claim 12, wherein:
    the first semiconductor device is disposed on a first surface of the circuit board, and the second semiconductor device is disposed on a second surface of the circuit board; or
    the first semiconductor device and the second semiconductor device are disposed laterally on a same surface of the circuit board.

14. The electronic system of claim 7, wherein the first ESD protection unit comprises:
    a first ESD protection element coupled between the first electrical contact and a voltage terminal, wherein the voltage terminal is coupled to a ground or a power voltage;
    a second ESD protection element; and
    a control circuit coupled in series with the second ESD protection element between the first operation electrical contact and the ground.

15. The electronic system of claim 14, wherein the control circuit comprises a switch, and the first logic circuit is configured to turn on or turn off the switch for adjusting the capacitance of the first ESD protection unit.

16. The electronic system of claim 14, wherein the control circuit comprises a fuse, and the first logic circuit is configured to burn out the fuse to decrease the capacitance of the first ESD protection unit.

* * * * *